(12) United States Patent
Kashiwagi

(10) Patent No.: US 7,222,276 B2
(45) Date of Patent: May 22, 2007

(54) SCAN TEST CIRCUIT INCLUDING A CONTROL TEST MODE

(75) Inventor: Shinji Kashiwagi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 361 days.

(21) Appl. No.: 10/127,959

(22) Filed: Apr. 23, 2002

(65) Prior Publication Data

US 2002/0162065 A1 Oct. 31, 2002

(30) Foreign Application Priority Data

Apr. 26, 2001 (JP) ............................. 2001-129360

(51) Int. Cl.
*G01R 31/28* (2006.01)
(52) U.S. Cl. ..................................................... 714/726
(58) Field of Classification Search ................ 714/724, 714/726, 727, 729, 731, 733
See application file for complete search history.

(56) References Cited

U.S. PATENT DOCUMENTS 6,092,226 A * 7/2000 Kramer et al. ............... 714/727

* cited by examiner

*Primary Examiner*—James C Kerveros
(74) *Attorney, Agent, or Firm*—Darryl G. Walker

(57) ABSTRACT

A scan test circuit (100) including a path for capturing a control signal during a test mode is disclosed. Scan test circuit (100) may include a control supply circuit (20), a clock control circuit (30), a control signal test circuit (40), and a scan flip-flop (1). Control supply circuit (20) may receive a control signal (Enable signal), which may be used for enabling a clock signal (CLK) in a gated clock system. A control supply test circuit (40) may provide a signal path that can apply control signal (Enable signal) to scan flip-flop (1) for capturing. In this way, functionality of a combination circuit used for generating a control signal (Enable signal) may be verified.

26 Claims, 3 Drawing Sheets

SCAN TEST CIRCUIT INCLUDING A CONTROL TEST MODE

TECHNICAL FIELD

The present invention relates generally to a test circuit and more particularly to a scan test circuit to which a gated clock system may be applied.

BACKGROUND OF THE INVENTION

A flip-flop or a latch circuit may be used to form a synchronizing circuit (hereinafter generally referred to as a register). A clock signal is typically supplied to the register for synchronization. However, when the number of registers is large, the capacitance load on the clock signal can affect operating speeds. In order to disperse the load of the clock signal, a buffer cell may be interposed between a clock signal supply source and the register. The buffer cell can be driven at a relatively low speed and may form a clock "tree" so that a clock signal does not drive too large a load. In this case, a gated clock system may be used. In a gated clock system a gate function that can mask the clock signal is added to the clock tree. The gate function masks the clock signal in a period of time that the clock signal is not required in the functional specification of a semiconductor integrated circuit.

A scan test method can be used to allow the semiconductor integrated circuit to be more efficiently tested. In a scan test method, registers in the semiconductor integrated circuit are connected in series (scan chain) and operate as a shift register. By doing so, data can be held or captured in the registers and then scanned off the semiconductor integrated circuit and compared with expected test data values on a tester.

Referring now to FIG. 5, a circuit schematic diagram of a conventional scan test circuit is set forth and given the general reference character 500. Conventional scan test circuit 500 is an example in which a gated clock system is applied to a scan test circuit.

Conventional scan test circuit 500 includes a multiplexer flip-flop (hereinafter referred to as a "scan FF") 1, an AND gate 4, a level latch 2, an OR gate 3 and an AND gate 5.

AND gate 4 receives a CLK signal and a SCANTEST signal and provides an output to a control input C of level latch 2. AND gate 4 provides an output based on an AND of CLK signal and an inversion of SCANTEST signal. Level latch 2 receives an Enable signal at an input D and provides an output Q1 to an input of OR gate 3. Level latch 2 functions as a hold time assuring transparent latch that latches the Enable signal.

OR gate 3 receives SCANTEST signal at another input and provides an output to an input of AND gate 5. AND gate 5 receives CLK signal at another input and provides an output to a clock terminal CLK of scan FF 1. Scan FF 1 receives a SCANIN signal, DATAIN signal, and a ScanEnable signal and provides an output Q2. Scan FF 1 functions as a scan register.

Enable signal can have a phase different from the CLK signal. Level latch 2 provides the Enable signal at a time of a trailing edge of the CLK signal during normal operation and holds Enable signal when CLK signal is high. In this way, output Q1 is not changed during the period that CLK signal is high and a gated clock signal can be supplied to the clock terminal CLK of scan FF 1 without glitches.

OR gate 3 and AND gate 5 function to supply the CLK signal to the clock terminal CLK of scan FF 1 so that the CLK signal is masked with output Q1 of level latch 2 in the normal operation and the CLK signal propagates through unchanged during the scan test.

In conventional scan test circuit 500, because the CLK signal is always supplied to scan FF 1 during the scan test, a capture operation that receives the DATAIN signal from, for example, a combination circuit and a shift operation that receives the SCANIN signal from a register that is one stage earlier in the scan chain can be executed by switching the ScanEnable signal.

However, an Enable signal is also output from the combination circuit. In a test operation conventional scan test circuit 500, the Enable signal is not captured and latched as data by scan FF 1 and is not provided to an external output terminal through a scan path. Thus, a failure of a logic circuit that generates the Enable signal may not be detectable. This can reduce the defect detection of the combination circuit.

If the above problem is solved by providing the Enable signal to an output terminal during a normal operation, the structure of the circuit can be complicated and the test pattern can be enlarged. Although the capacity of a memory mounted on an LSI tester is increased, the defect detection ratio is not greatly improved and a design cycle time and costs can be increased.

In view of the above discussion, it would be desirable to provide a scan test circuit which may operate to allow detection of a failure of a control signal, such as an enable signal. It would also be desirable to provide a signal path for a control signal to an output of a scan test circuit. It would also be desirable to provide a signal path for a control signal to an output of a scan test circuit that may also be used to output scan data and data provided by a combination circuit.

SUMMARY OF THE INVENTION

According to the present embodiments, a scan test circuit may include a path for capturing a control signal during a test mode. A scan test circuit may include a control supply circuit, a clock control circuit, a control signal test circuit, and a scan flip-flop. A control supply circuit may receive a control signal which may be used for enabling a clock signal in a gated clock system. A control supply test circuit may provide a signal path used to apply a control signal to a scan flip-flop for capturing. In this way, functionality of a combination circuit used for generating a control signal may be verified.

According to one aspect of the embodiments, a scan test circuit may include a control signal test circuit coupled to receive a control signal. A control signal may include a control signal logic level. The control signal test circuit may provide a control test circuit output based on the control signal logic level to a scan flip-flop during a control test mode of operation.

According to another aspect of the embodiments, a control signal test circuit may be coupled to receive a data signal having a data signal logic level. The control signal test circuit may provide a control test circuit output based on the data signal logic level during a normal mode of operation.

According to another aspect of the embodiments, during a test mode of operation, the control signal test circuit may be coupled to provide the control test circuit output based on a logic combination of the control signal logic level and the data signal logic level.

According to another aspect of the embodiments, the logic combination may be an exclusive OR or an exclusive NOR type combination.

According to another aspect of the embodiments, a scan test circuit may include a clock control circuit. The clock control circuit may be coupled to receive the control signal and may provide a clock signal to the scan flip-flop when the control signal has an enable logic level.

According to another aspect of the embodiments, the clock control circuit may be coupled to receive a test mode signal. The test mode signal may have a test mode logic level during a test mode of operation. The clock control circuit may provide the clock signal to the scan flip-flop when the test mode signal has the test mode logic level.

According to another aspect of the embodiments, a scan flip-flop may be coupled to receive a scan data signal, a data signal, a scan enable signal, and a clock signal. The scan flip-flop may provide a scan flip-flop output in synchronism with the clock signal. The scan flip-flop output may be based on the scan data signal when the scan enable signal has a first scan enable logic level and may be based on the data signal when the scan enable has a second scan enable logic level.

According to another aspect of the embodiments, a scan test circuit may include first data provided from a combination circuit. A scan flip-flop may be coupled to receive scan data in a scan chain at a scan data input terminal. A control signal test circuit output may be received at a data input terminal. A clock control circuit may be coupled to receive a control signal and may provide a clock signal to a clock input terminal of the scan flip-flop. A control signal test circuit may be coupled to receive the control signal and the first data and may provide the control signal test circuit output.

According to another aspect of the embodiments, a control supply circuit may be coupled to receive the control signal and may provide a control supply circuit output to the clock control circuit.

According to another aspect of the embodiments, the control signal test circuit may be coupled to receive the control supply circuit output.

According to another aspect of the embodiments, the scan flip-flop may be coupled to receive a scan enable signal. The scan flip-flop may latch the scan data in synchronism with the clock signal when the scan enable signal has a first logic level and may latch the control signal test circuit output in synchronism with the clock signal when the scan enable signal has a second logic level.

According to another aspect of the embodiments, the control signal test circuit may be coupled to receive a control capture signal. The control capture signal may have a first control capture logic level and a second control capture logic level. The control signal test circuit may provide the control signal test circuit output having a control signal test logic level based on the first data when the control capture signal has the first control capture logic level and having a control signal test logic level based on the control signal when the control capture signal has the second logic level.

According to another aspect of the embodiments, the control signal may be provided form the combination logic.

According to another aspect of the embodiments, the clock control circuit may be coupled to receive a scan test enable signal.

According to another aspect of the embodiments, a scan test circuit may include first data provided from a combination circuit. A scan-flip flop may be coupled to receive scan data in a scan chain at a scan data input terminal and a control signal test circuit output at a data input terminal. A control supply circuit may be coupled to receive a control signal from the combination circuit and provide a control supply output. A clock control circuit may be coupled to receive a control supply output and may provide a clock signal to a clock input terminal of the scan flip-flop. A control signal test circuit may be coupled to receive the control signal and the first data and provide the control signal test circuit output.

According to another aspect of the embodiments, the clock control circuit may include a first logic gate. The first logic gate may be coupled to receive the control supply output and a first clock signal and may provide the clock signal to the clock input terminal when the control supply output has a clock enable logic level.

According to another aspect of the embodiments, the first logic gate may be coupled to receive a scan test enable signal. The first logic gate may provide the clock signal to the clock input terminal when the scan test enable signal has a scan test enable logic level.

According to another aspect of the embodiments, the clock control circuit may be disabled when the scan test signal has a scan test disable logic level and the control supply output has a clock disable logic level.

According to another aspect of the embodiments, the control signal test circuit may be coupled to receive the control signal through the control supply circuit. The control signal test circuit may provide the control signal test circuit output based on an exclusive logic function of the control signal and the first data when a scan test signal has a scan test enable logic level.

According to another aspect of the embodiments, the control signal test circuit may be coupled to receive a control capture signal having a first control capture logic level and a second control capture logic level. The control signal test circuit may provide the control signal test circuit output having a control signal test logic level based on the first data when the control capture signal has the first control capture logic level and the control signal test logic level may be based on the control signal when the control capture signal has the second logic level.

DETAILED DESCRIPTION OF THE EMBODIMENTS

A scan test circuit according to the present embodiments provides a way for allowing a register to receive a control signal, such as an enable signal provided from a combination circuit, so that a clock signal may only be provided to the register during a period of time as functionally required.

A scan test circuit according to the embodiments may include a gated clock system applied to a scan flip-flop (scan FF) that may selectively provide data from a combination circuit or scan data in a scan chain. An enable signal supply circuit may receive an enable signal from a combination circuit and may enable a clock control circuit so that a clock signal may only be applied to a scan FF during a period of time as functionally required. A signal path may be provided for the enable signal to an output terminal of the scan flip-flop. In this way, functionality of combination logic for generating the enable signal may be verified.

Various embodiments of the present invention will now be described in detail with reference to a number of drawings.

Figure 1:
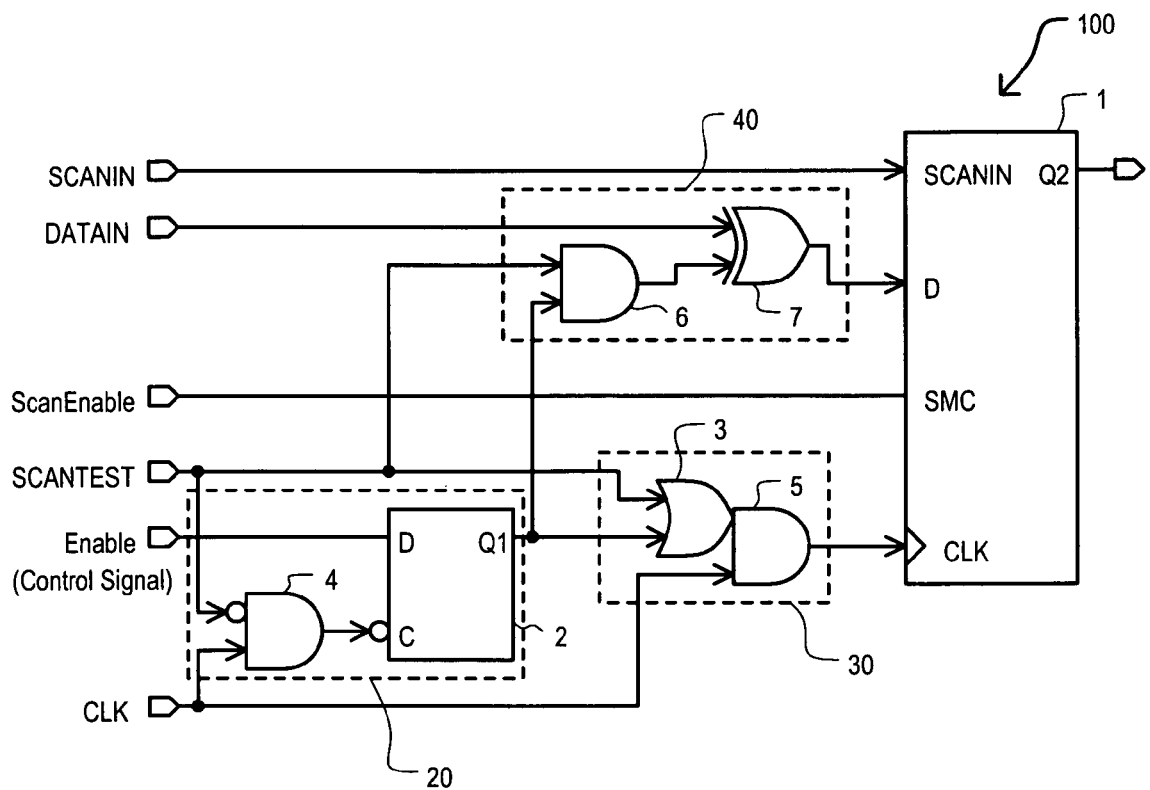
FIG. 1 is a circuit schematic diagram of a scan test circuit according to an embodiment.

Referring to FIG. 1, a scan test circuit according to an embodiment is set forth in a circuit schematic diagram and given the general reference character 100. Scan test circuit 100 may include similar constituents as conventional scan test circuit 500 and such similar constituents may be referred to by the same reference characters.

Scan test circuit 100 may include a control supply circuit 20, a clock control circuit 30, a control signal test circuit 40, and a scan flip-flop (scan FF) 1. Scan test circuit 100 may receive a SCANIN signal, a DATAIN signal, a ScanEnable signal, a SCANTEST signal, an Enable signal, and a CLK signal and may provide an output Q2 from scan FF 1.

Control supply circuit 20 may receive an ENABLE signal, SCANTEST signal, and a CLK signal and may provide an output to clock control circuit 30 and a control signal test circuit 40. Control supply circuit 20 may include an AND gate 4 and a level latch 2. AND gate 4 may receive SCANTEST signal and a CLK signal and may provide an output to a control terminal C of level latch 2. Level latch 2 may receive Enable signal at an input D and may provide an output Q1 to clock control circuit 30 and control signal test circuit 40.

Clock control circuit 30 may receive SCANTEST signal, CLK signal, and an output Q1 from level latch 2 and may provide an output to a terminal CLK of scan FF 1. Clock control circuit 30 may include an OR gate 3 and an AND gate 5. OR gate 3 may receive SCANTEST signal and an output Q1 from level latch 2 and may provide an output to an input of AND gate 5. AND gate 5 may receive CLK signal at another input and may provide an output to a terminal CLK of scan FF 1.

Control signal test circuit 40 may receive DATAIN signal, SCANTEST signal, and an output Q1 from level latch 2 and may provide an output to an input terminal D of scan FF 1. Control signal test circuit 40 may include an AND gate 6 and an exclusive OR circuit 7. AND gate 6 may receive SCANTEST signal and an output Q1 from level latch 2 and may provide an output to an input of exclusive OR circuit 7. Exclusive OR circuit 7 may receive DATAIN signal at another input and may provide an output to an input terminal D of scan FF 1. Control signal test circuit 40 may provide a signal path for capturing the Enable signal during a test, such as a scan test.

DATAIN signal and Enable signal may be provided by a combination circuit at a previous stage. DATAIN signal may be captured during normal operation or during a scan test. Enable signal may be a control signal for a gated clock. When Enable signal is high, control supply circuit 20 may operate to enable clock control circuit 30 and CLK signal may be applied to scan FF 1. The SCANIN signal may be provided from a register at a preveious stage of the scan chain and may be invalid during a normal operation. ScanEnable signal may be provided to select whether scan FF 1 can output SCANIN signal or an output of control signal test circuit 40 in synchronism with a clock signal receive at clock terminal CLK. If ScanEnable signal is low ("0"), scan FF 1 can output a signal received at input terminal D. However, if ScanEnable signal is high ("1"), scan FF 1 can output SCANIN signal. Thus, scan FF 1 may operate as a clocked multiplexer selectively providing a signal received at input terminal D or a SCANIN signal in accordance with a value of a ScanEnable signal.

During a scan test operation, ScanEnable signal and SCANTEST signal may each be high. During this operation, clock control circuit 30 may be enabled and may provide CLK signal as an input at clock terminal CLK of scan FF 1 and SCANIN signal may be output from scan FF 1 in synchronism with CLK signal. In this way, a scan test may be executed so that data can be held or captured in the registers and then scanned off the semiconductor integrated circuit and compared with expected test data values on a tester. This may allow a semiconductor integrated circuit to be efficiently tested.

Control supply circuit 20 may provide an enable signal for clock control circuit 30 during normal operations. In this way, CLK signal may only be applied to scan FF 1 during required time periods. Thus, scan FF 1 may not have unnecessary operations and power consumption may be reduced. AND gate 4 may receive a CLK signal and a SCANTEST signal and may provide an output to a control input C of level latch 2. AND gate 4 may provide an output based on an AND of CLK signal and an inversion of SCANTEST signal. Level latch 2 may receive an Enable signal at an input D and may provide an output Q1 to an input of OR gate 3. During normal operation, level latch 2 may function as a hold time assuring transparent latch that latches the Enable signal. Enable signal may have a phase different from the CLK signal. Level latch 2 may provide the Enable signal at a time of a trailing edge of the CLK signal during normal operation and may hold Enable signal when CLK signal is high. During a normal operation, SCANTEST signal may be low. Thus, AND gate 4 may provide CLK signal as an output to a control input C of level latch 2. When control input C receives a low level signal, level latch 2 may provide Enable signal as an output Q1 and when control input C receives a low to high transition, a logic value of Enable signal is latched as an output Q1. In this way, output Q1 may not be changed during the period that CLK signal is high and a gated clock signal may be supplied to the clock terminal CLK of scan FF 1 without glitches.

However, during a scan test, control supply circuit 20 may operate to provide Enable signal to control signal test circuit 40. During a scan test, SCANTEST signal may be high. With SCANTEST signal high, the output of AND gate 4 may be low ("0") and level latch 2 may be transparent to provide Enable signal as an output Q1 to an input of control signal test circuit 40.

During normal operation, SCANTEST signal may be low ("0") and OR gate 3 within clock control circuit 30 may output the logic level of output Q1 of level latch 2 to AND gate 5. As a result, when the output Q1 of level latch 2 is high ("1"), clock control circuit 30 may output gated CLK signal to clock input terminal CLK of scan FF 1. In this way, the CLK signal may be gated and provided to a scan FF 1 without glitches. However, because SCANTEST signal may become high ("1") during a scan test, the output Q1 of level latch 2 may be masked and CLK signal may always be supplied to clock terminal CLK of scan FF 1.

Control signal test circuit 40 may also receive output Q1 of level latch 2. Output Q1 of level latch 2 and SCANTEST signal may be supplied to AND gate 6. In this way, when SCANTEST is high ("1"), Enable signal may be provided (through level latch 2) as an input to exclusive OR circuit 7. Thus, an exclusive OR function of Enable signal and DATAIN signal may be provided to input terminal D of scan FF 1. When ScanEnable signal is low, a logic value at input terminal D may be provided at output Q2 of scan FF 1 synchronously with CLK signal. By doing so, a combination circuit that generates an Enable signal may be tested to verify proper functionality.

The operation of scan test circuit 100 will now be described with reference to FIGS. 2 and 3 in conjunction with FIG. 1.

Figure 2:
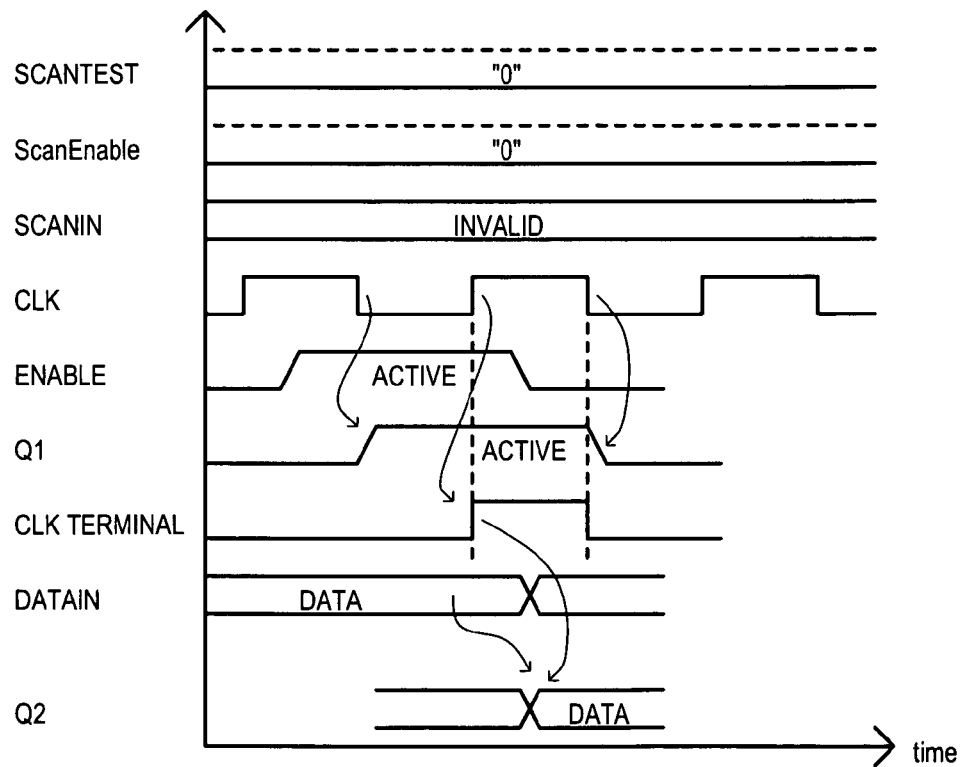
FIG. 2 is a timing diagram illustrating a normal operation of a scan test circuit according to an embodiment.

FIG. 2 is a timing diagram illustrating a normal operation of scan test circuit 100 illustrated in FIG. 1.

Referring now to FIG. 2 in conjunction with FIG. 1, during a normal operation, SCANTEST signal and ScanEnable signal may be low ("0"). With ScanEnable signal low, scan FF 1 may select data from input terminal D, thus the SCANIN signal may be considered invalid. Because SCANTEST signal is also low ("0"), the output of AND gate 6 may be low ("0") and exclusive OR circuit 7 may provide DATAIN signal to an input terminal D of scan FF 1.

Because SCANTEST is low, AND gate 4 may output the CLK signal to an input C of level latch 2. Thus, when CLK signal transitions from a high level to a low level (trailing edge), level latch 2 may provide Enable signal as an output Q1. With SCANTEST signal low, OR gate 3 within clock control circuit 30 may provide a high output when control supply circuit 20 provides a high output Q1 from level latch 2. In this way, AND gate 5 may be enabled when output Q1 transitions high and CLK signal may be output by clock control circuit 40 and may be received at clock terminal CLK of scan FF 1.

When clock terminal CLK of scan FF 1 receives a high signal, scan FF 1 may capture the DATAIN signal from terminal D and provide an output Q2 accordingly. Output Q2 may be provided to a scan FF 1 at a subsequent stage of a scan chain, as just one example. By providing a clock control circuit 30 that may be controlled by a control supply circuit 20, the CLK signal may only be supplied to a clock terminal CLK of a scan FF 1 for a time period as may be desired to execute the capture operation.

Figure 3:
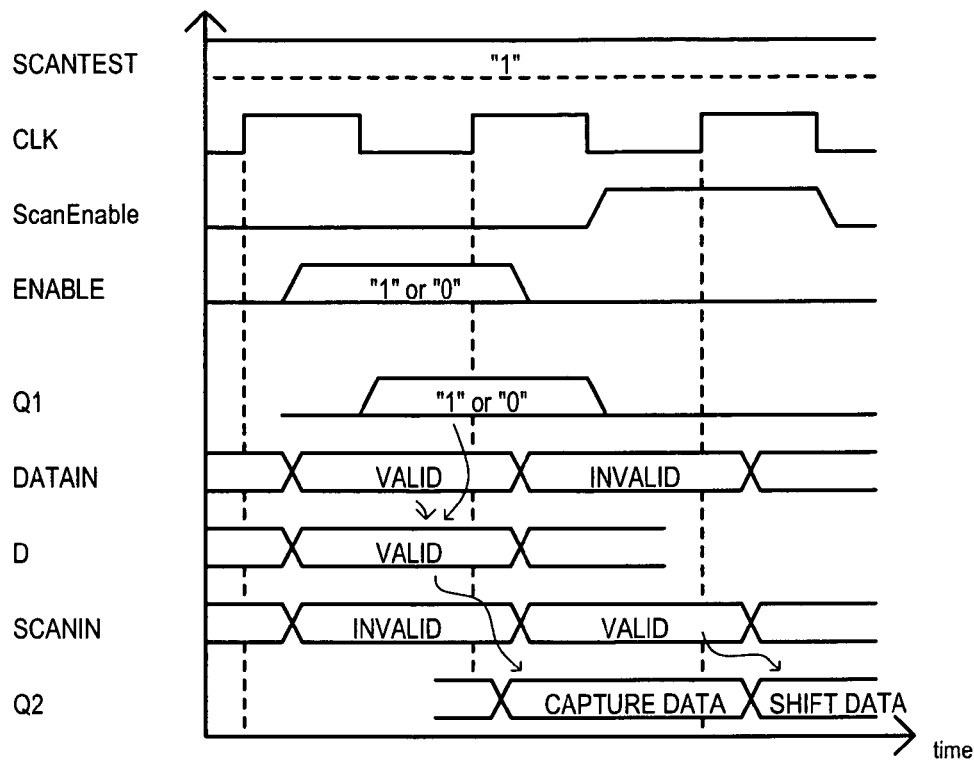
FIG. 3 is a timing diagram illustrating a scan test operation of a scan test circuit according to an embodiment.

FIG. 3 is a timing diagram illustrating a scan test operation of scan test circuit 100 illustrated in FIG. 1.

Referring now to FIG. 3 in conjunction with FIG. 1, during a scan test operation, SCANTEST signal be high ("1"). However, ScanEnable signal may be low ("0") or high ("1") in accordance as to whether a SCANIN signal or a signal provided by control signal test circuit 40 is to be captured. When ScanEnable signal is low, SCANIN signal may be considered as invalid.

With SCANTEST signal high, the output of NOR 3 may be high and AND gate 5 may be enabled. In this way, clock control circuit 30 may output CLK signal to clock terminal CLK of scan FF 1. Also, with SCANTEST high, an output of AND gate 4 in control supply circuit 20 may be low. With an output of AND gate 4 low, level latch 2 may be essentially transparent and Enable signal may be provided at output Q1. In this way, control supply circuit 20 may provide Enable signal as an input to control signal test circuit 40. Furthermore, with SCANTEST signal high, AND gate 6 within control supply circuit 20 may output Enable signal to an input of exclusive OR circuit 7. Terminal D of scan FF 1 may receive a signal from exclusive OR circuit 7 that may be an exclusive OR logic function of DATAIN signal and Enable signal. With ScanEnable signal low at this time, the signal received at terminal D of scan FF 1 may be provided at output Q2 in synchronism with CLK signal. In this way, output Q2 captured during a scan test may have a logic value based on a logic value of Enable signal and functionality of a combination circuit used for generating Enable signal may be verified.

Then, when ScanEnable signal becomes high ("1"), SCANIN signal may be considered valid and may be captured during a scan test in synchronism with CLK signal. In this way, a SCANIN signal from a register at a previous stage of a scan chain may be provided as shift data from output Q2 of scan FF 1.

Figure 4:
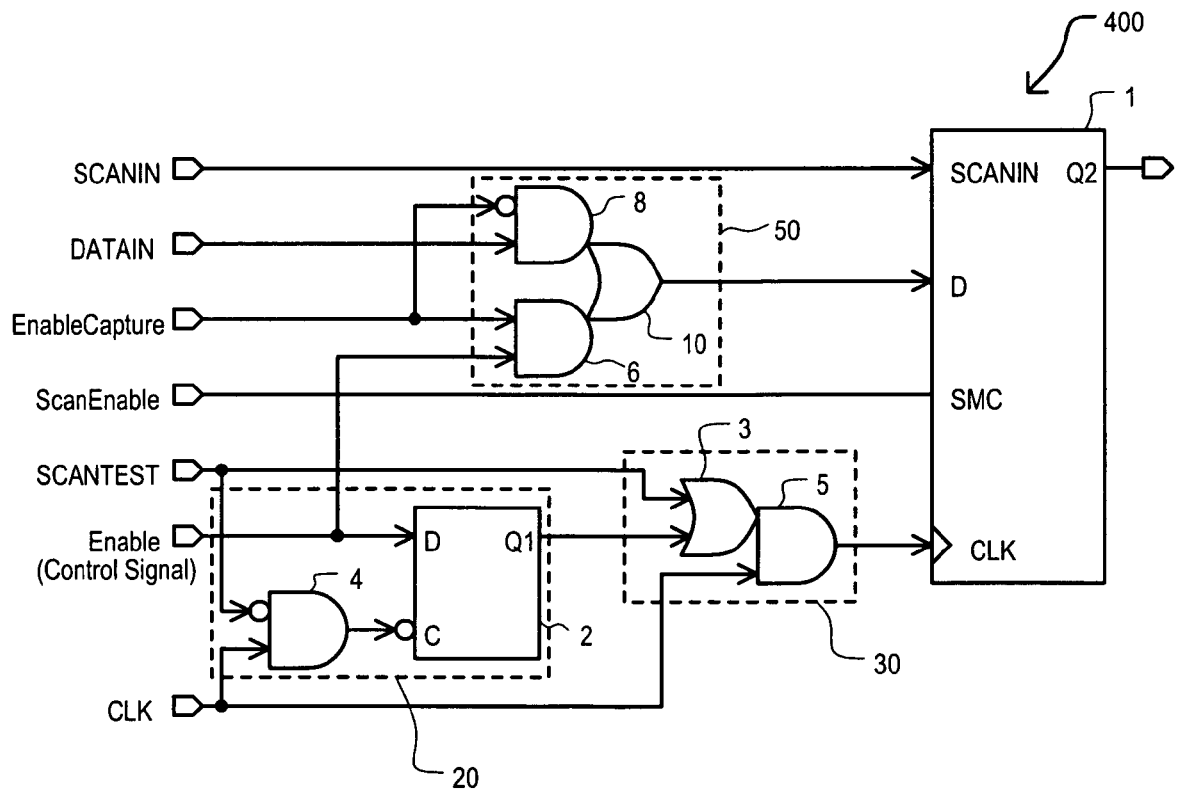
FIG. 4 is a circuit schematic diagram of a scan test circuit according to an embodiment.
Figure 5:
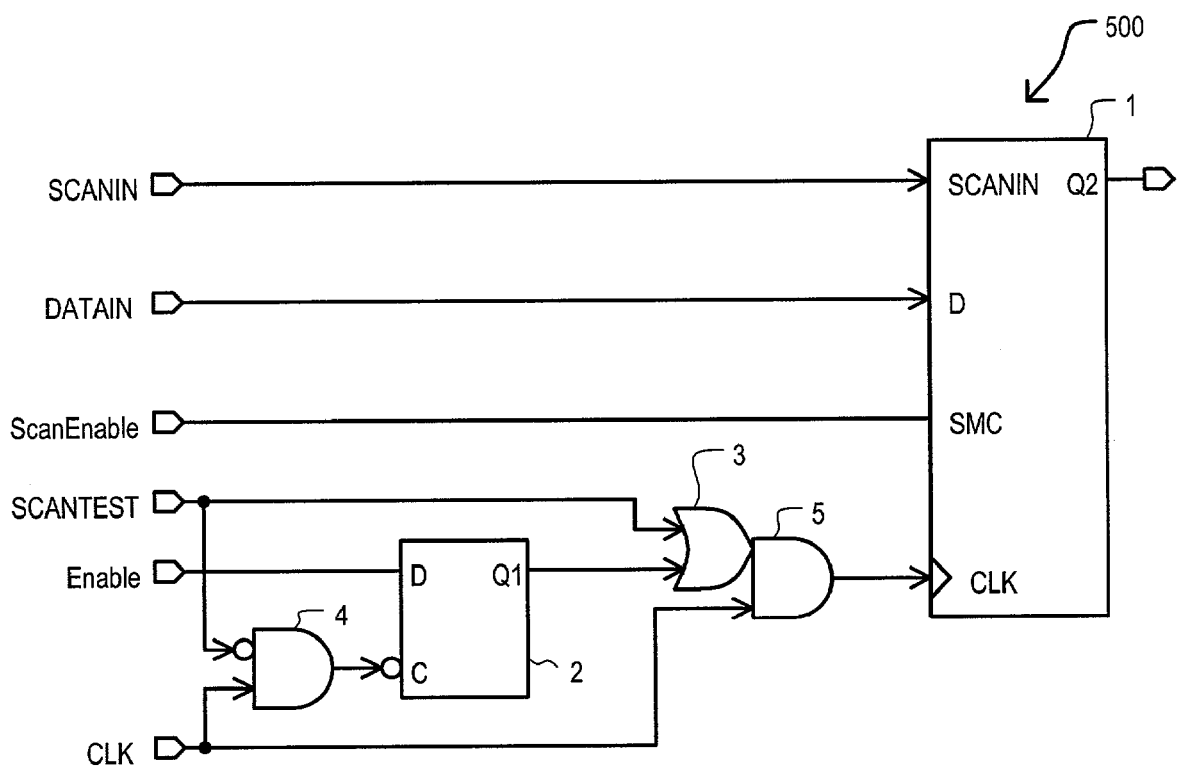
FIG. 5 is a circuit schematic diagram of a conventional scan test circuit.

Referring now to FIG. 4, a circuit schematic diagram of a scan test circuit according to an embodiment is set forth and given the general reference character 400. Scan test circuit 400 may include similar constituents as scan test circuit 100 and such similar constituents may be referred to by the same reference characters.

Scan test circuit 400 may include a control supply circuit 20, a clock control circuit 30, a control signal test circuit 50, and a scan flip-flop (scan FF) 1. Scan test circuit 400 may receive a SCANIN signal, a DATAIN signal, a ScanEnable signal, a SCANTEST signal, an Enable signal, and a CLK signal and may provide an output Q2 from scan FF 1.

In the embodiment of FIG. 4, an EnableCapture signal may be included. The Enable Capture signal may be supplied from a tester, as just one example. EnableCapture signal may be received by control signal test circuit 50. Control signal test circuit 50 may include AND gates (6 and 8) and OR gate 10. AND gate 6 may receive an Enable signal at one input and EnableCapture signal at another input and may provide an output to an input of OR gate 10. AND gate 8 may receive a DATAIN signal at one input and an inverted EnableCapture signal at another input and may provide an output to an input of OR gate 10. In this way, control signal test circuit 50 may select either a DATAIN signal or an Enable signal (control signal), independently, to be provided at terminal D of a scan FF 1.

During a normal operation, the EnableCapture signal may be low ("0"). In this way, DATAIN signal may be captured by scan FF 1 when ScanEnable signal is low. However, in a test operation, EnableCapture signal may become high ("1"). In this case, control signal test circuit 50 may provide Enable signal as an output and the Enable signal may be captured by scan FF 1 when ScanEnable signal is low.

In a scan test, SCANTEST signal may become high, and CLK signal may be provided to clock terminal CLK of scan FF 1 independently as to the value of Enable signal. If EnableCapture signal is high and ScanEnable signal is low during this test, Enable signal may be captured by scan FF 1 and provided as output Q1 synchronously with CLK signal. In this way, functionality of a combination circuit used for generating a control signal, such as Enable signal, may be verified.

However, if EnableCapture signal is low and ScanEnable signal is low during this test, DATAIN signal may be captured by scan FF 1 and provided as output Q1 synchronously with CLK signal.

Likewise, if ScanEnable signal is high during a scan test. SCANIN signal may be captured by scan FF 1 and provided as output Q1 synchronously with CLK signal.

In the above-described embodiments, control supply circuit 20 and clock control circuit 30 may be conceptualized as a gated clock circuit. In scan test circuit 100, a gated clock circuit may include a signal path used to apply a control signal, such as an Enable signal to a scan FF 1, during a test mode. However, scan test circuit 400 applies a path for Enable signal to a scan FF 1 independently of a gated clock circuit. By doing so, the gated clock circuit may be shifted to another portion on a clock tree and not included in a scan test circuit, as just one example.

As described above, according to the embodiments, in a scan test circuit including a gated clock system, a path for capturing a control signal (such as an Enable signal for the gated clock system, as just one example) may be provided. In this way, functionality of a combination logic circuit used for generating the control signal may be verified.

It is understood that the embodiments described above are exemplary and the present invention should not be limited to those embodiments. Specific structures should not be limited to the described embodiments.

For example, a test mode of operation used for testing functionality of a combination circuit generating a control signal may be a test mode independent to a scan test, yet incorporating circuitry in a scan test circuit. In this way, control signals within the scan test circuit may be verified in alternative test modes, as just one example.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A scan test circuit, comprising:
  a control signal test circuit coupled to receive a control signal having a control signal logic level and to provide a control test circuit output based on the control signal logic level to a scan flip-flop to verify the control signal during a control test mode of operation; and
  a clock control circuit coupled to receive the control signal and provide a clock signal to the scan flip-flop when the control signal has an enable logic level.

2. The scan test circuit according to claim 1, wherein:
  the control signal test circuit is coupled to receive a data signal having a data signal logic level and provides the control test circuit output based on the data signal logic level during a normal mode of operation.

3. The scan test circuit according to claim 1, wherein:
  during the control test mode of operation, the control signal test circuit is coupled to provide the control test circuit output based on a logic combination of the control signal logic level and the data signal logic level.

4. The scan test circuit according to claim 3, wherein:
  the logic combination is selected from the group comprising an exclusive OR or an exclusive NOR.

5. The scan test circuit according to claim 1, wherein:
  the clock control circuit is coupled to receive a test mode signal having a test mode logic level during the control test mode of operation and provide the clock signal to the scan flip-flop when the test mode signal has the test mode logic level.

6. The scan test circuit according to claim 1, wherein:
  the scan flip-flop is coupled to receive a scan data signal, a data signal, a scan enable signal, and a clock signal and provides a scan flip-flop output in synchronism with the clock signal, and the scan flip-flop output is based on the scan data signal when the scan enable signal has a first scan enable logic level and is based on the data signal when the scan enable signal has a second scan enable logic level.

7. A scan test circuit, comprising:
  a scan flip-flop coupled to receive scan data in a scan chain at a scan data input terminal and a control signal test circuit output at a data input terminal;
  a clock control circuit coupled to receive a control signal and provide a clock signal to a clock input terminal of the scan flip-flop; and
  a control signal test circuit coupled to receive the control signal and a first data from a combination circuit and provide the control signal test circuit output to verify the control signal during a control test mode of operation.

8. The scan test circuit according to claim 7, further including:
  a control supply circuit coupled to receive the control signal and provide a control supply circuit output to the clock control circuit.

9. The scan test circuit according to claim 8, wherein:
  the control signal test circuit is coupled to receive the control supply circuit output.

10. The scan test circuit according to claim 7, wherein:
  the scan flip-flop is coupled to receive a scan enable signal and latch the scan data in synchronism with the clock signal when the scan enable signal has a first logic level and latch the control signal test circuit output in synchronism with the clock signal when the scan enable signal has a second logic level.

11. The scan test circuit according to claim 7, wherein:
  the control signal test circuit is coupled to receive a control capture signal having a first control capture logic level and a second control capture logic level, and provide the control signal test circuit output having a control signal test logic level based on the first data when the control capture signal has the first control capture logic level and the control signal test logic level based on the control signal when the control capture signal has the second logic level.

12. The scan test circuit according to claim 7, wherein:
  the control signal is provided from the combination circuit.

13. The scan test circuit according to claim 7, wherein:
  the clock control circuit is coupled to receive a scan test enable signal.

14. A scan test circuit, comprising:
  a scan flip-flop coupled to receive scan data in a scan chain at a scan data input terminal and a control signal test circuit output at a data input terminal;
  a control supply circuit coupled to receive a control signal from a combination circuit and provide a control supply output;
  a clock control circuit coupled to receive the control supply output and provide a clock signal to a clock input terminal of the scan flip-flop; and
  a control signal test circuit coupled to receive the control signal and the first data from the combination circuit and provide the control signal test circuit output to verify the control signal during a control test mode of operation.

15. The scan test circuit according to claim 14, wherein:
  the clock control circuit includes a first logic gate coupled to receive the control supply output and a first clock signal and provide the clock signal to the clock input terminal when the control supply output has a clock enable logic level.

16. The scan test circuit according to claim 15, wherein:
  the first logic gate is coupled to receive a scan test enable signal and provides the clock signal to the clock input terminal when the scan test enable signal has a scan test enable logic level.

17. The scan test circuit according to claim 16, wherein:
  the clock control circuit is disabled when the scan test enable signal has a scan test disable logic level and the control supply output has a clock disable logic level.

18. The scan test circuit according to claim 14, wherein:
  the control signal test circuit is coupled to receive the control signal through the control supply circuit and provides the control signal test circuit output based on an exclusive logic function of the control signal and the first data when a scan test signal has a scan test enable logic level.

19. The scan test circuit according to claim 14, wherein:
the control signal test circuit is coupled to receive a control capture signal having a first control capture logic level and a second control capture logic level, and provide the control signal test circuit output having a control signal test logic level based on the first data when the control capture signal has the first control capture logic level and the control signal test logic level based on the control signal when the control capture signal has the second logic level.

20. A scan circuit, comprising:
a flip-flop having a data terminal and a clock terminal;
a clock gating circuit receiving a clock signal, a clock enable signal and providing said clock signal to said clock terminal of said flip-flop, said clock gating circuit being provided to gate said clock signal according to a logic level of said clock enable signal; and
a signal path allowing said clock enable signal to be captured by said flip-flop through said data terminal.

21. The scan circuit according to claim 20, wherein:
said clock gating circuit receives a gate enable signal, and gates said clock signal according to a logic level of said clock enable signal when said gate enable signal has enable logic level, and provides said clock signal to said clock terminal of said flip-flop independent of logic level of said clock enable signal when said gate enable signal has disable level.

22. The scan circuit according to claim 21, wherein:
said flip-flop has a scan terminal receiving a scan data and a scan enable terminal receiving a scan enable signal; and
said flip-flop captures said scan data from said scan terminal when said scan enable signal has an enable logic level, and captures a data from said data terminal when said scan enable signal has a disable logic level.

23. The scan circuit according to claim 22, wherein said gate enable signal and said scan enable signal are independent of each other.

24. The scan circuit according to claim 21, wherein:
said signal path having
a mask circuit receiving a mask enable signal and said clock enable signal and masking said clock enable signal according to a logic level of said mask signal.

25. The scan circuit according to claim 24, wherein said mask enable signal is said gate enable signal.

26. The scan circuit according to claim 24, wherein said mask enable signal and said gate enable signal are independent of each other.

* * * * *